(12) United States Patent
Tanzawa

(10) Patent No.: US 10,050,049 B2
(45) Date of Patent: Aug. 14, 2018

(54) APPARATUSES INCLUDING MEMORY ARRAYS WITH SOURCE CONTACTS ADJACENT EDGES OF SOURCES

(71) Applicant: Micron Technology, Inc., Boise, ID (US)

(72) Inventor: Toru Tanzawa, Adachi (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/041,277

(22) Filed: Feb. 11, 2016

(65) Prior Publication Data

US 2016/0163726 A1 Jun. 9, 2016

Related U.S. Application Data

(63) Continuation of application No. 14/200,348, filed on Mar. 7, 2014, now Pat. No. 9,263,461.

(51) Int. Cl.
*H01L 27/115* (2017.01)
*H01L 27/24* (2006.01)
(Continued)

(52) U.S. Cl.
CPC .... *H01L 27/11556* (2013.01); *H01L 27/1157* (2013.01); *H01L 27/11524* (2013.01);
(Continued)

(58) Field of Classification Search
None
See application file for complete search history.

(56) References Cited

U.S. PATENT DOCUMENTS 6,221,762 B1* 4/2001 Byun ............... H01L 21/28518
257/E21.165
6,667,510 B2 12/2003 Wu
(Continued)

FOREIGN PATENT DOCUMENTS

CN 1841748 A 10/2006
CN 101326642 A 12/2008
(Continued)

OTHER PUBLICATIONS

Wolf and Tauber, Silicon Processing for the VLSI Era vol. 1—Process Fabrication; Lattice Press: Sunset Beach, CA, 1986, pp. 384-385.*

(Continued)

*Primary Examiner* — Erik Kielin
(74) *Attorney, Agent, or Firm* — Schwegman Lundberg & Woessner, P.A.

(57) ABSTRACT

Various apparatuses, including three-dimensional (3D) memory devices and systems including the same, are described herein. In one embodiment, a 3D memory device can include at least two sources; at least two memory arrays respectively formed over and coupled to the at least two sources; and a source conductor electrically respectively coupled to the at least two sources using source contacts adjacent one or more edges of the source. Each of the at least two memory arrays can include memory cells, control gates, and data lines. There is no data line between an edge of a source and the source contacts adjacent the edge.

10 Claims, 10 Drawing Sheets

(51) Int. Cl.
*H01L 27/11556* (2017.01)
*H01L 27/11582* (2017.01)
*H01L 27/11548* (2017.01)
*H01L 27/11575* (2017.01)
*H01L 27/11524* (2017.01)
*H01L 27/11526* (2017.01)
*H01L 27/1157* (2017.01)
*H01L 27/11573* (2017.01)

(52) U.S. Cl.
CPC .. *H01L 27/11526* (2013.01); *H01L 27/11548* (2013.01); *H01L 27/11573* (2013.01); *H01L 27/11575* (2013.01); *H01L 27/11582* (2013.01); *H01L 27/249* (2013.01)

(56) References Cited

U.S. PATENT DOCUMENTS

| | | | |
|---|---|---|---|
| 9,263,461 | B2 | 2/2016 | Tanzawa |
| 2002/0158273 | A1 | 10/2002 | Satoh et al. |
| 2004/0094786 | A1 | 5/2004 | Tran et al. |
| 2009/0230462 | A1 | 9/2009 | Tanaka et al. |
| 2009/0242968 | A1* | 10/2009 | Maeda ............... H01L 27/11551 257/324 |
| 2009/0267128 | A1* | 10/2009 | Maejima ........... H01L 27/11565 257/314 |
| 2009/0310425 | A1 | 12/2009 | Sim et al. |
| 2010/0117143 | A1 | 5/2010 | Lee et al. |
| 2010/0193861 | A1 | 8/2010 | Shim et al. |
| 2010/0238732 | A1 | 9/2010 | Hishida et al. |
| 2010/0320526 | A1 | 12/2010 | Kidoh et al. |
| 2011/0175159 | A1 | 7/2011 | Itagaki et al. |
| 2011/0220987 | A1 | 9/2011 | Tanaka et al. |
| 2012/0043601 | A1 | 2/2012 | Maeda et al. |
| 2012/0182808 | A1 | 7/2012 | Lue et al. |
| 2013/0130495 | A1 | 5/2013 | Higashitani et al. |
| 2013/0171806 | A1 | 7/2013 | Shim et al. |
| 2013/0234101 | A1 | 9/2013 | Sasoga et al. |
| 2013/0242654 | A1 | 9/2013 | Sim et al. |
| 2013/0279262 | A1 | 10/2013 | Yoon et al. |
| 2013/0320424 | A1* | 12/2013 | Lee .................... H01L 27/1158 257/314 |
| 2014/0231954 | A1 | 8/2014 | Lue |
| 2015/0249093 | A1* | 9/2015 | Lee .................. H01L 27/11582 257/324 |
| 2015/0255478 | A1 | 9/2015 | Tanzawa |

FOREIGN PATENT DOCUMENTS

| | | |
|---|---|---|
| CN | 101651144 A | 2/2010 |
| CN | 106170863 A | 11/2016 |
| JP | 2009224612 A | 10/2009 |
| JP | 2009238871 A | 10/2009 |
| JP | 2010080729 A | 4/2010 |
| JP | 2010114113 A | 5/2010 |
| JP | 2010118659 A | 5/2010 |
| JP | 2010225222 A | 10/2010 |
| JP | 2011187794 A | 9/2011 |
| KR | 1020100052597 A | 5/2010 |
| WO | WO-2012070096 A1 | 5/2012 |
| WO | WO-2015134727 A1 | 9/2015 |

OTHER PUBLICATIONS

"International Application Serial No. PCT/US2015/018930, International Search Report dated Jun. 30, 2015", 3 pgs.
"International Application Serial No. PCT/US2015/018930, Written Opinion dated Jun. 30, 2015", 6 pgs.
"International Application Serial No. PCT/US2015/018930, International Preliminary Report on Patentability dated Sep. 22, 2016", 8 pgs.
"Taiwanese Application Serial No. 104107300, Amendment filed Apr. 17, 2015", 4 pgs.
"Chinese Application Serial No. 201580019493.6, Office Action dated May 4, 2017", W/Translation, 26 pgs.
"Chinese Application Serial No. 201580019493.6, Office Action dated Jan. 11, 2018", w/English Translation, 7 pgs.
"Chinese Application Serial No. 201580019493.6, Response filed Nov. 20, 2017 to Office Action dated May 4, 2017", w/English Claims, 50 pgs.
"European Application Serial No. 15758612.4, Invitation pursuant to Rule 62a(1) EPC dated Oct. 6, 2017", 2 pgs.
"European Application Serial No. 15758612.4, Response filed Oct. 19, 2017 to Communication Pursuant to Rules 161(2) and 162 EPC dated Oct. 19, 2016", 8 pgs.
"European Application Serial No. 15758612.4, Response filed Dec. 18, 2017 to Invitation pursuant to Rule 62a(1) EPC dated Oct. 6, 2017", 7 pgs.
"Japanese Application Serial No. 2016-555611, Office Action dated Oct. 17, 2017", With English Translation, 25 pgs.
"Japanese Application Serial No. 2016-555611, Response Filed Nov. 20, 2017 to Office Action dated Oct. 17, 2017", w/English Claims, 25 pgs.
"Korean Application Serial No. 10-2016-7027969, Notice of Preliminary Rejection dated Nov. 30, 2017", w/English Translation, (Nov. 30, 2017), 7 pgs.
"Korean Application Serial No. 10-2016-7027969, Response filed Jan. 31, 2018 to Notice of Preliminary Rejection dated Nov. 30, 2017", w/English Claims, 24 pgs.
"European Application Serial No. 15758612.4, Extended European Search Report dated Feb. 13, 2018", 10 pgs.
"Japanese Application Serial No. 2016-555611, Office Action dated Mar. 20, 2018", w/ English Translation, 23 pgs.

\* cited by examiner

US 10,050,049 B2

APPARATUSES INCLUDING MEMORY ARRAYS WITH SOURCE CONTACTS ADJACENT EDGES OF SOURCES

PRIORITY APPLICATION

This application is a continuation of U.S. application Ser. No. 14/200,348, filed Mar. 7, 2014, which is incorporated herein by reference in its entirety.

BACKGROUND

With the development of the semiconductor industry, three-dimensional (3D) semiconductor devices are getting more attractive due to their increased storage capability. In a 3D memory device, a source is generally routed using interconnection layers including source contacts. Some memory devices may include source contacts inside memory arrays. However, a large number of source contacts in a memory array of a memory device may degrade the efficiency of the memory array and result in a large die size and a high fabrication cost.

DESCRIPTION OF THE EMBODIMENTS

The following detailed description refers to the accompanying drawings which show, by way of illustration, specific aspects and embodiments in which the present subject matter may be practiced. These embodiments are described in sufficient detail to enable those skilled in the art to practice the present subject matter.

The term "horizontal" as used in this application is defined as a plane parallel to the conventional plane or surface of a substrate, such as a wafer or portion thereof, regardless of the actual orientation of the wafer or substrate. The term "vertical" refers to a direction perpendicular to the horizontal as defined above. Prepositions, such as "on," "side," "higher," "lower," "over," "below," and "under" are defined with respect to the conventional plane or surface being on the top surface of the wafer or substrate, regardless of the actual orientation of the wafer or substrate.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the present subject matter is defined only by the appended claims, along with the full scope of equivalents to which such claims are entitled.

NAND array architecture is an array of memory cells arranged such that the memory cells are coupled in logical rows to access lines, which are conventionally referred to as word lines. The access lines are coupled to, and in some cases are at least partially formed by, the Control Gates (CGs) of the memory cells. A string of memory cells of the array are coupled together in series between a source and a data line, which is conventionally referred to as a bit line.

Memory cells in the NAND array architecture can be programmed to a desired data state. A memory cell conventionally can be programmed to a desired one of at least two data states (e.g., a "1" or a "0" state). Memory cells conventionally can be programmed to a desired one of more than two data states.

Figure 1:
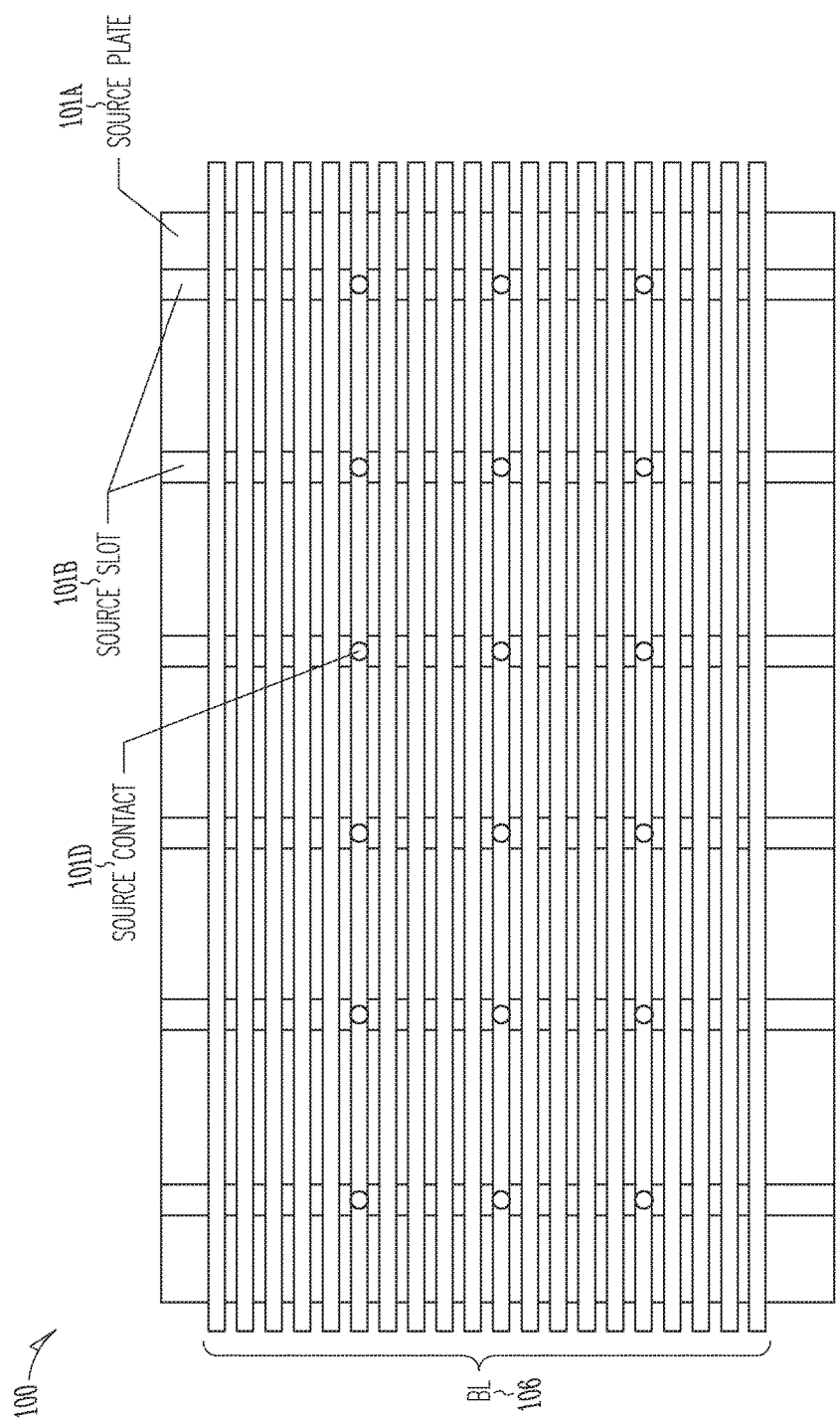
FIG. 1 is a top view of a memory device, according to a prior art.

FIG. 1 is a top view of an apparatus in the form of a 3D memory device, according to a prior architecture contemplated by the applicant. As shown in FIG. 1, a 3D memory device 100 (e.g., a 3D NAND array structure) may include a source plate 101A, source slots 101B, and bit lines (BL) 106 for example. The source plate 101A may be routed to a source terminal (e.g., a Common Source Line or "CSL") of the memory device 100 via conductive source contacts 101D. However, frequent source contacts 101D inside the array structure may degrade the array efficiency of the 3D memory device 100. Since the currents of all the NAND strings in the same block may flow into the CSL, the CSL confronts a challenge that the sheet resistance in the CSL has to be low enough to reduce the source noise. Furthermore, additional space used between neighbor blocks may cause an overhead on the block pitch, which may result in a large die size and a high fabrication cost.

Figure 2A:
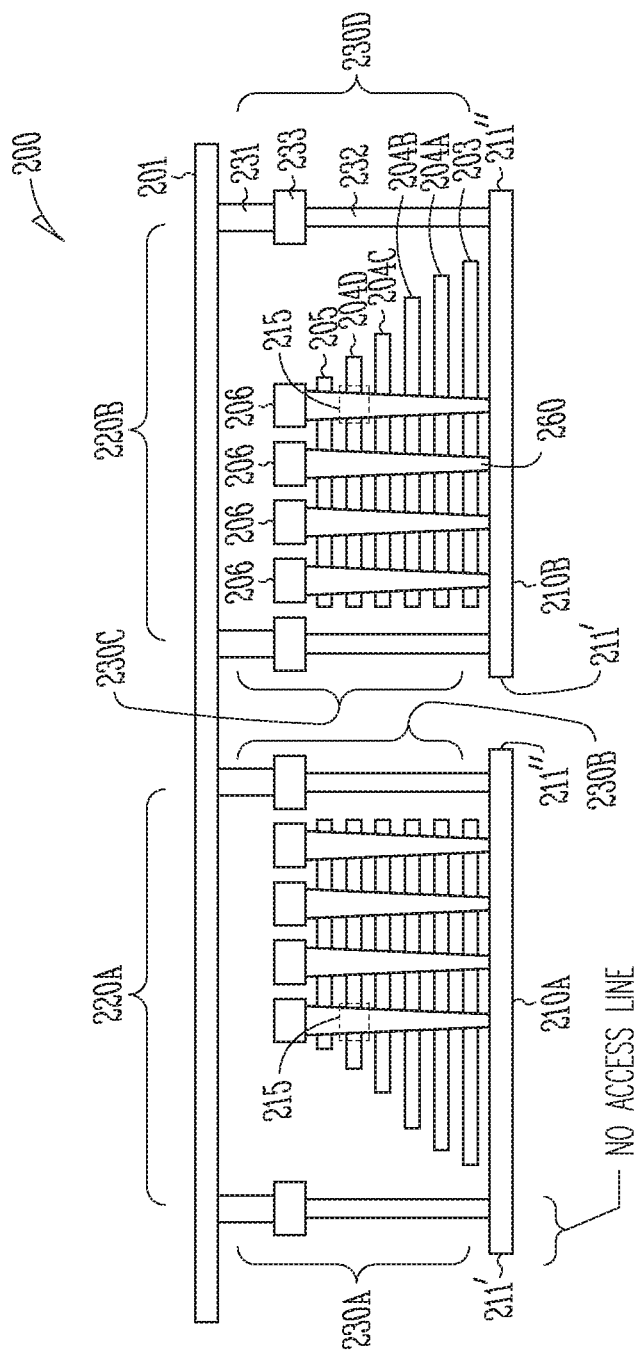
FIG. 2A is a side cross-sectional view of a memory device, according to an embodiment.

FIG. 2A is a side cross-sectional view of a 3D memory device 200, according to an embodiment of the subject matter. The 3D memory device 200 may include divided sources 210 (e.g., source plates/regions 210A and 210B, which are separated from each other), and divided memory arrays 220 (e.g., 220A and 220B). The divided memory arrays 220 may be respectively formed over (e.g., on) and coupled to the divided sources 210. A source (e.g., 210A) of the divided sources may include an edge 211' on one side and an edge 211" on the opposite side. For purposes of brevity and clarity, same tiers, regions, and/or elements in a 3D memory device will be identified by the same reference numerals throughout FIGS. 2-7.

In an embodiment, the divided sources 210 may comprise a metal material or a combination of metal and silicon (e.g., a WSi material). In another embodiment, the divided sources 210 may comprise a stack of metal material and polysilicon material. In still another embodiment, the divided sources 210 may comprise a stack of polysilicon material and a combination of metal and silicon (e.g., a WSi material). In a further embodiment, the divided sources 210 may comprises doped regions of a semiconductor substrate. Embodiments of the present invention, however, are not limited to any particular one of the above-described sources.

In an embodiment, a memory array (e.g., 220A) of the divided memory arrays 220 may include memory cells 215, vertical pillars 260, a source conductor (e.g., a source line) 201, a ground select line (GSL)/source select gate (SGS) 203, control gates/word lines (CGs/WLs) 204A, 204B, 204C and 204D), a string select line (SSL)/drain select gate (SGD) 205, and data lines 206. In another embodiment, the memory array (e.g., 220A) of the divided memory arrays 220 may include a plurality of source conductors 201. Each memory cell 215 may be electrically coupled to a control gate of the control gates 204, and a data line of the data lines 206. In an embodiment, the control gates 204 may include word lines (WL) 204A-204D, and the data lines 206 may include bit lines (BL) 206 for example.

In an embodiment, the source conductor 201 may be electrically coupled to both of the divided sources 210 through source contacts 230 (such as 230A, 230B, 230C and 230D). In an embodiment, a source contact 230 of the source contacts 230 may include a first contact (e.g., a first plug) 231 to contact the at least one source conductor 201, a second contact (e.g., a second plug) 232 to contact a source (e.g., 210A) of the at least two divided sources 210, and a conductive connector 233 to contact the first contact 231 and the second contact 232.

Figure 2B:
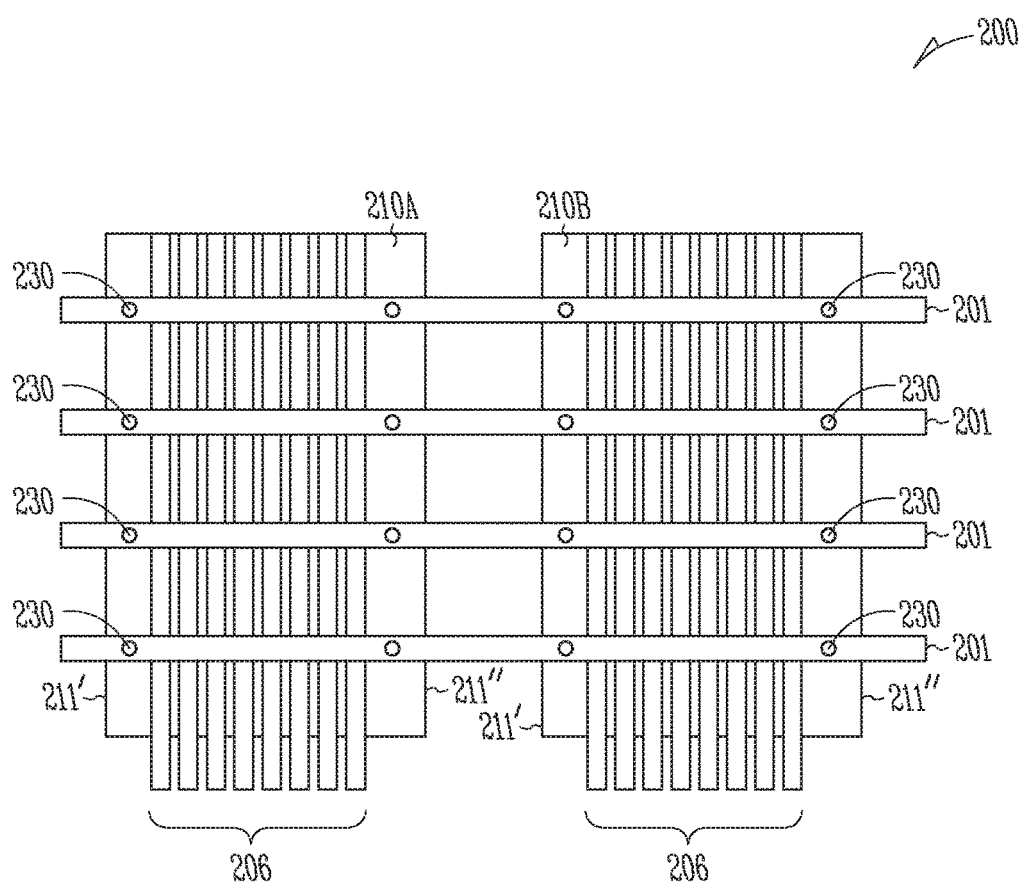
FIG. 2B is a top view of the memory device as shown in FIG. 2A, according to an embodiment.

FIG. 2B is a top view of the memory device 200 as shown in FIG. 2A, according to an embodiment. As shown in FIG. 2B, the source conductors 201 may be coupled to the divided sources 210 through source contacts 230 adjacent edges of the sources 210. There is no data line 206 between an edge 211 (e.g., 211') of a source 210 (e.g., 210A) and the source contacts 230 adjacent to the edge 211. For example, there is no data line 206 between an edge 211' of the source 210A and the source contacts 230 adjacent to the edge 211', and there is no data line 206 between an edge 211" of the source 210A and the source contacts 230 adjacent to the edge 211".

Figure 4A:
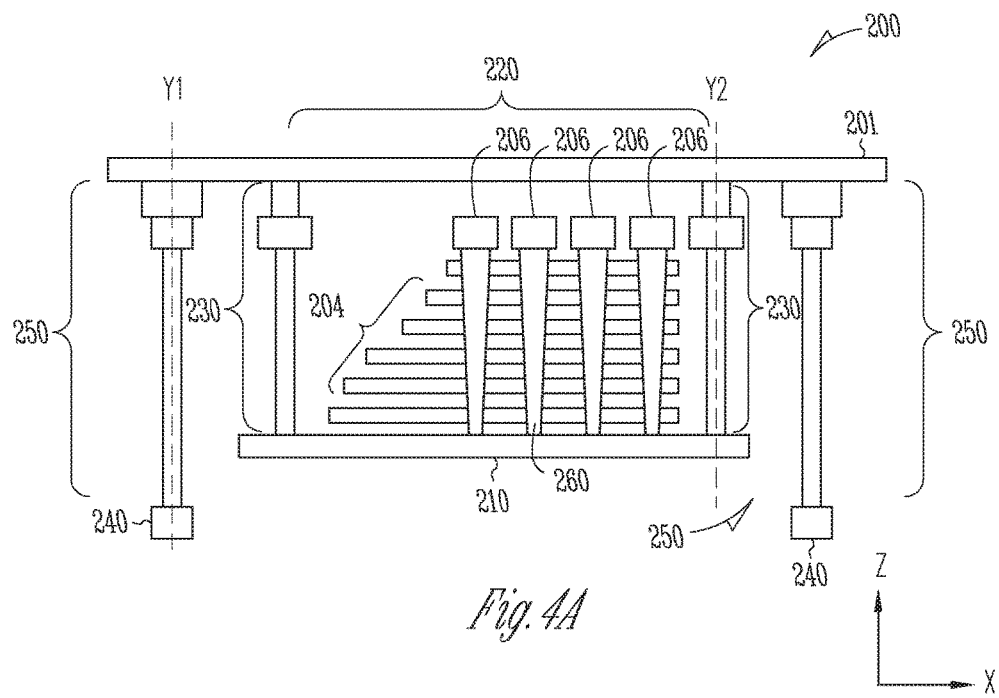
FIG. 4A is a side cross-sectional view of a memory device, according to an embodiment.

As shown in FIGS. 2A and 2B, an array 220 (e.g., 220A) may share control gates 204 or data lines 206 without source routing (such as source contacts) inside the array 220. An amount of current between a data line 206 of each memory cell and the source conductor 201 can be used as binary data of the memory cell. The source noise can be reduced. Additionally, since the contacts are placed adjacent an edge of an array in a control gate direction, (e.g., WL direction), the die size overhead can be reduced. The control gate direction may be the "X" direction as shown in FIG. 4A.

Figure 3A:
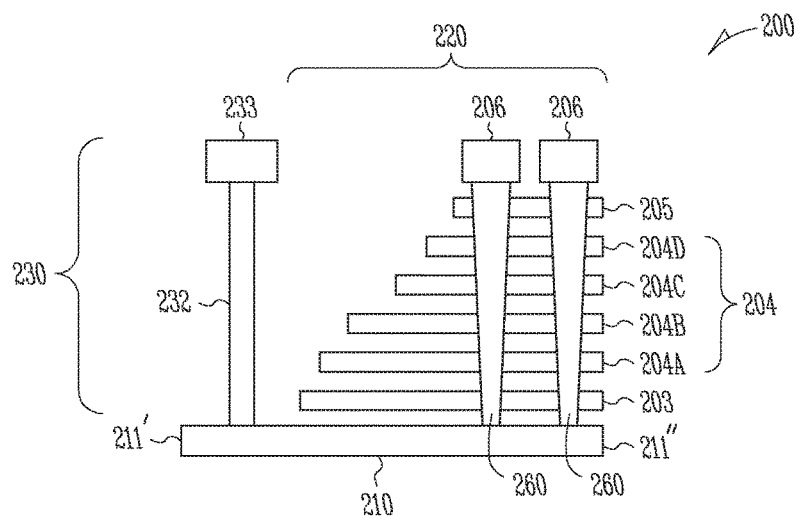
FIG. 3A is a side cross-sectional view of a memory device, according to an embodiment.
Figure 3B:
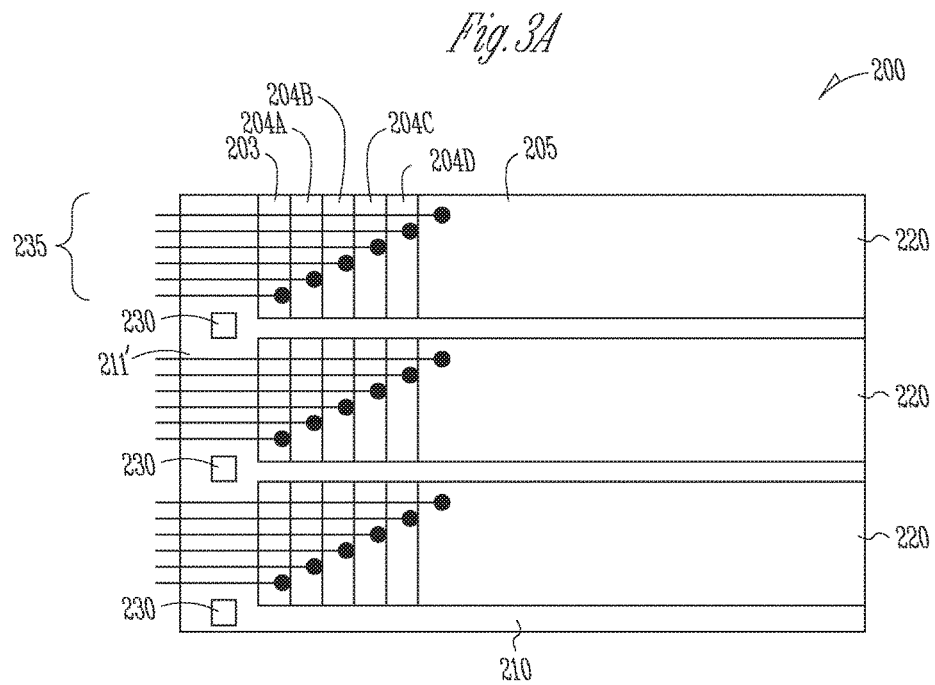
FIG. 3B is a top view of the memory device as shown in FIG. 3A, according to an embodiment.

FIG. 3A is a side cross-sectional view of a memory device according to an embodiment, and FIG. 3B is a top view of the memory device as shown in FIG. 3A. As shown in FIGS. 3A and 3B, a memory device 200 may include a source 210, and a memory array 220 formed over (e.g., on) and coupled to the source 210. In an embodiment, the memory array 220 may include memory cells 215 (as indicated in e.g., FIG. 2A), vertical pillars 260, a ground select line (GSL) 203, control gates 204 (such as word lines WL including 204A-D), a string select line (SSL) 205, and data lines 206. Control gates 204 may be coupled to control gate contacts.

In an embodiment, a source conductor 201 (as shown in e.g., FIG. 2A) may be electrically coupled to the source 210 through one or more conductive source contacts 230 adjacent an edge 211' of the source 210. There is no data line 206 between the edge 211' of the source 210 and the source contacts 230.

In an embodiment, as shown in FIGS. 3A and 3B, the source conductor 201 is electrically coupled to the source 210 using the source contacts 230 adjacent an edge 211' of the source 210 in an control gate (e.g., word line WL 204) direction, and the source contacts 230 may contact the source 210 adjacent the edge 211' of the source 210 on a side of and between groups of control gate contacts 235.

Figure 3C:
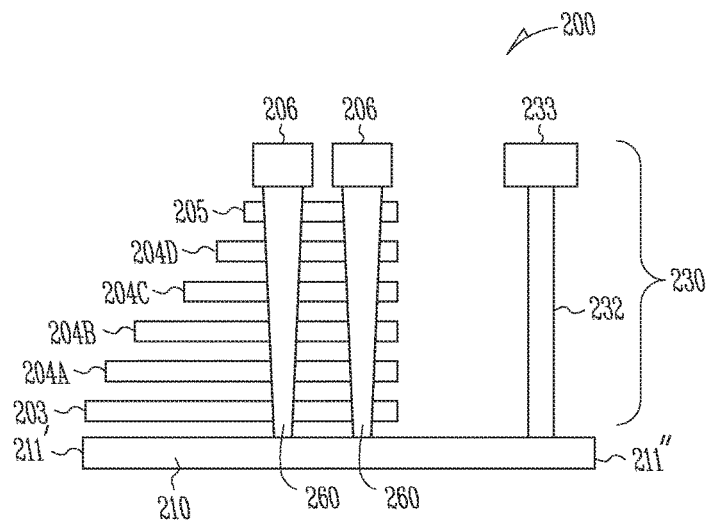
FIG. 3C is a side cross-sectional view of a memory device, according to an embodiment.
Figure 3D:
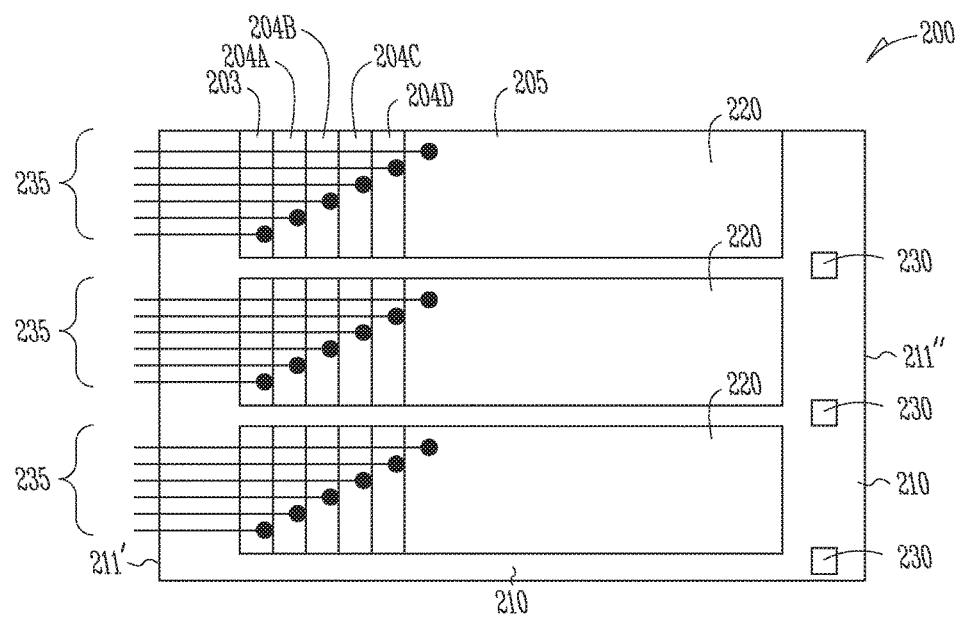
FIG. 3D is a top view of the memory device as shown in FIG. 3C, according to an embodiment.

FIG. 3C is a side cross-sectional view of a memory device, according to another embodiment. FIG. 3D is a top view of the memory device as shown in FIG. 3C. In an embodiment, a source conductor 201 (as shown in FIG. 2A) is electrically coupled to the source 210 using the source contacts 230 adjacent an edge 211" of the source 210 in an control gate (e.g., WL 204) direction, and the source contacts 230 may contact the source 210 at the edge 211" of the source 210 on a side opposite to the groups of control gate contacts 235.

In an embodiment, as shown in FIGS. 2A and 2B, the source contacts 230 may contact a source 210 (e.g., the source 210A) adjacent both of the edges 211' and 211" of the source 210.

Figure 4B:
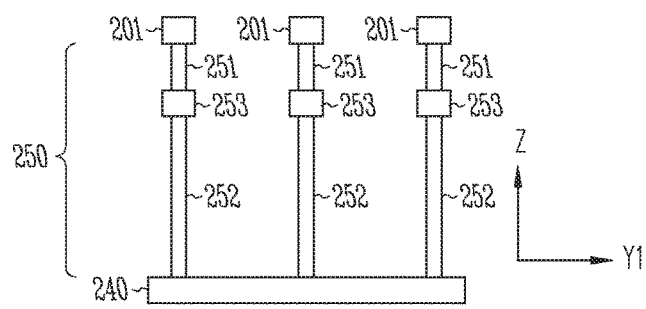
FIG. 4B is another side cross-sectional view of the memory device as shown in FIG. 4A, according to an embodiment.

In another embodiment, not shown in the figures, a source conductor 201 is electrically coupled to the source 210 using the source contacts 230 adjacent an edge of the source 210 in a data line (e.g., bit line BL) 206 direction. The data line direction may be the "Y1" direction as shown in FIGS. 4A and 4B.

FIG. 4A is a side cross-sectional view of a memory device 200, according to an embodiment. A 3D memory device 200 may include one (or more) memory array 220, one (or more) source conductor 201, and one (or more) interconnection component 240. In an embodiment, the memory array 220 may be coupled to a source 210, and may include memory cells 215, control gates 204, and data lines 206. In an embodiment, the source conductor 201 may extend over the memory array 220, and may be coupled to the source 210 using source contacts 230 adjacent one (or more) edge of the source 210.

In an embodiment, the memory array 220 may include a plurality of tiers of a first semiconductor material (such as poly-silicon material) to be used as the control gates 204 for example, and the memory array 220 may also include a plurality of vertical pillars 260 of a second semiconductor material (such as poly-silicon material) to be used as channels.

In an embodiment, the interconnection component 240 may extend perpendicular to the source conductor 201 and may be electrically coupled to the source conductor 201 using conductive interconnection contacts 250. In an embodiment, the interconnection component 240 may extend below the source 210.

FIG. 4B is another side cross-sectional view of the memory device 200 along the Y1 direction as shown in FIG. 4A, according to an embodiment. In an embodiment, as shown in FIG. 4B, the conductive interconnection contact 250 may include a first contact 251 to contact the source conductor 201, a second contact 252 to contact the interconnection component 240, and a third contact 253 to contact both the first contact 251 and the second contact 252.

Figure 4C:
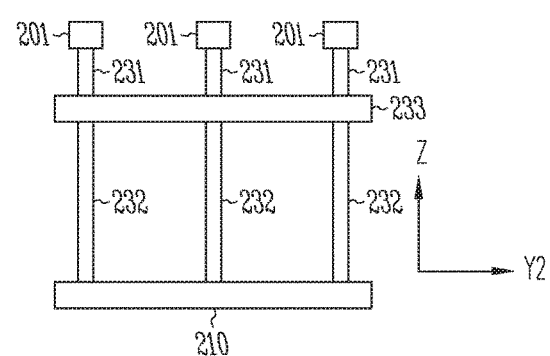
FIG. 4C is still another side cross-sectional view of the memory device as shown in FIG. 4A, according to an embodiment.

FIG. 4C is still another side cross-sectional view of the memory device 200 along the Y2 direction as shown in FIG. 4A, according to an embodiment. In an embodiment, as shown in FIG. 4C, a conductive source contact 230 (such as 230A as shown in FIG. 2A) may include a first contact 231 to contact the source conductor 201, a second contact 232 to contact the source 210, and a third contact 233 to contact both the first contact 231 and the second contact 232.

Figure 5A:
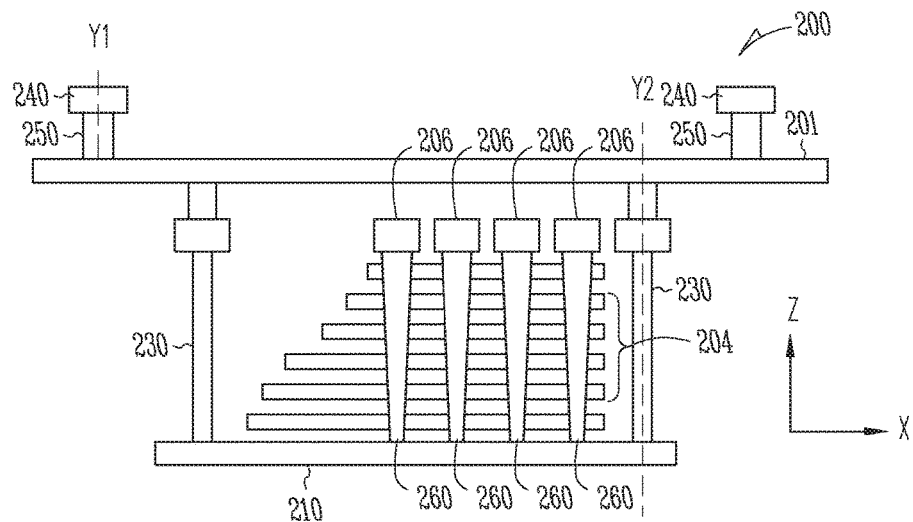
FIG. 5A is a side cross-sectional view of a memory device, according to an embodiment.

FIG. 5A is a side cross-sectional view of a memory device 200, according to an embodiment. The 3D memory device 200 may include one (or more) memory array 220 (such as 220A as shown in FIG. 2A), one (or more) source conductor 201, and one (or more) interconnection component 240. In an embodiment, the memory array 220 may be electrically coupled to a source 210, and may include memory cells 215 (as shown in FIG. 2A), control gates 204, and data lines 206. In an embodiment, the source conductor 201 may extend over the memory array 220, and may be electrically coupled to the source 210 using source contacts 230 adjacent one or more edges of the source 210.

In an embodiment, the interconnection component 240 may extend perpendicular to the source conductor 201 and may be electrically coupled to the source conductor 201 using interconnection contacts 250. In an embodiment, the interconnection component 240 may extend over the source 210.

Figure 5B:
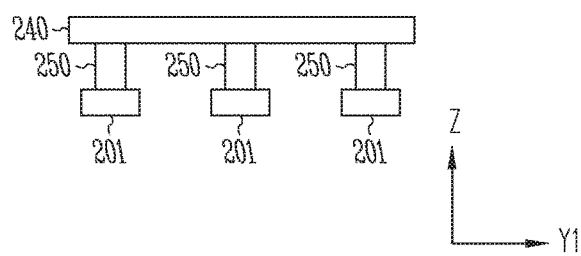
FIG. 5B is another side cross-sectional view of the memory device as shown in FIG. 5A, according to an embodiment.

FIG. 5B is another side cross-sectional view of the memory device 200 along the Y1 direction as shown in FIG. 5A, according to an embodiment. In an embodiment, an interconnection contact 250 may include a single conductive contact.

Figure 5C:
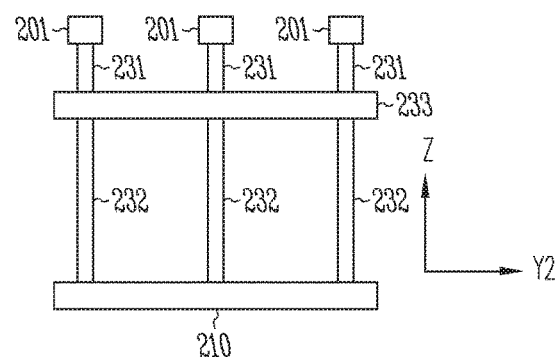
FIG. 5C is still another side cross-sectional view of the memory device as shown in FIG. 5A, according to an embodiment.

FIG. 5C is still another side cross-sectional view of the memory device 200 along the Y2 direction as shown in FIG. 5A, according to an embodiment. In an embodiment, a conductive source contact 230 (as shown in FIG. 5A) may include a first contact 231 to contact the source conductor 201, a second contact 232 to contact the source 210, and a third contact 233 to contact both the first contact 231 and the second contact 232.

Figure 6A:
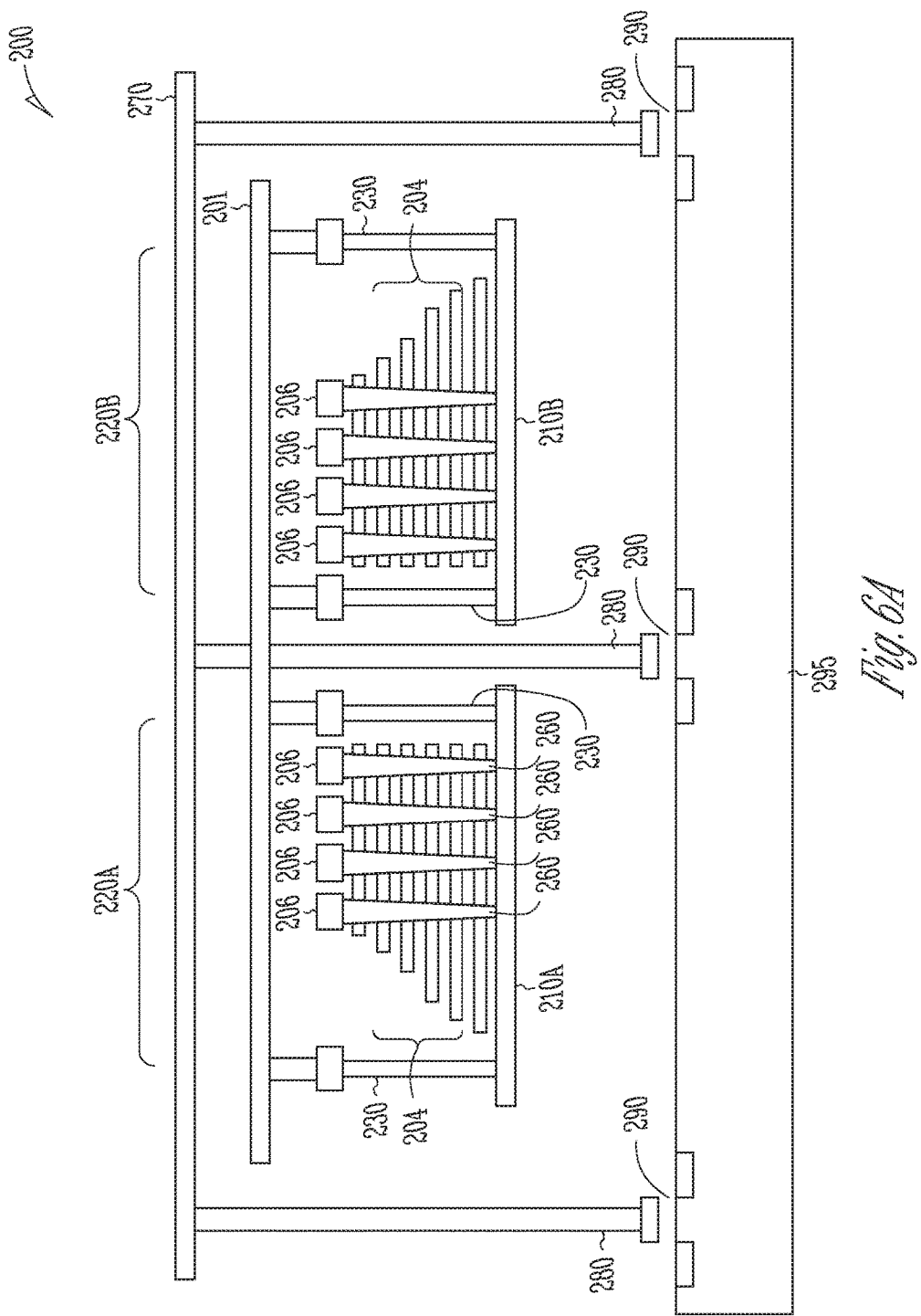
FIG. 6A is a side cross-sectional view of a memory device, according to an embodiment.
Figure 6B:
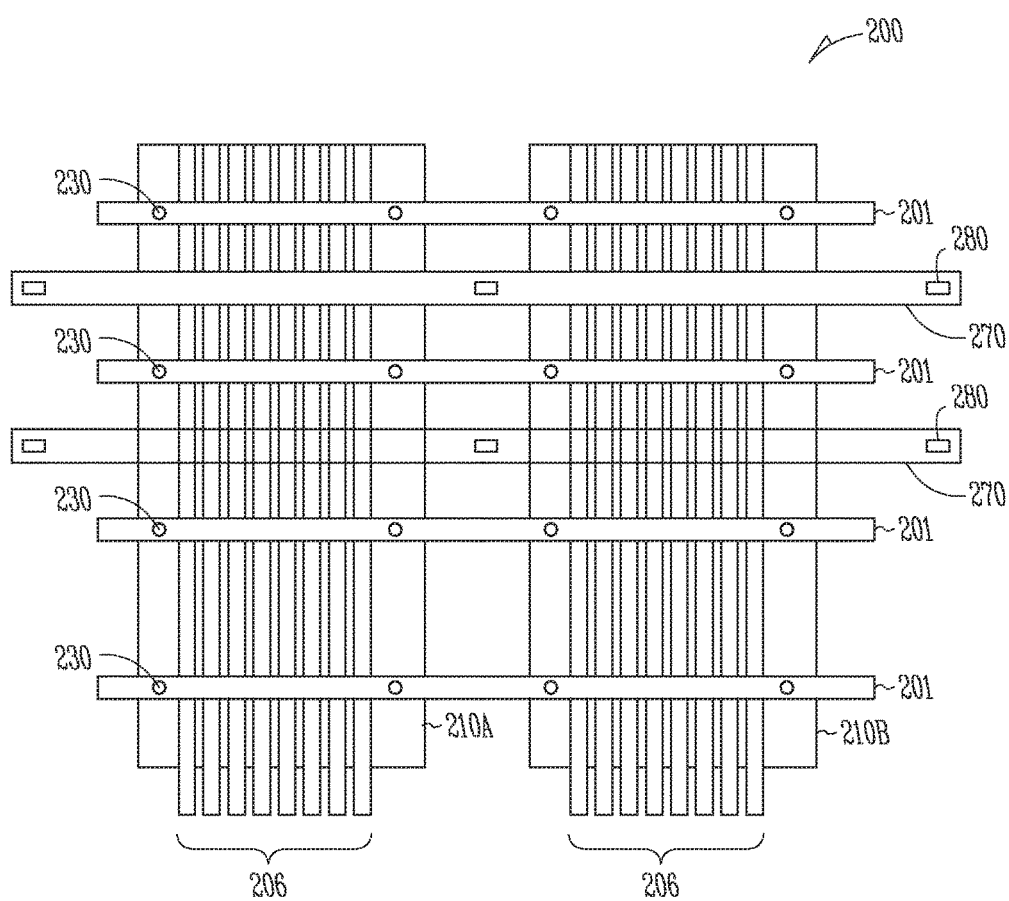
FIG. 6B is a top view of the memory device as shown in FIG. 6A, according to an embodiment.

FIG. 6A is a side cross-sectional view of a memory device 200, according to an embodiment. FIG. 6B is a top view of the memory device 200 as shown in FIG. 6A, according to an embodiment. The 3D memory device 200 may include divided sources 210 (such as 210A and 210B), memory arrays 220 (such as 220A and 220B) respectively coupled to the divided sources 210, a source conductor 201, and a signal conductor (e.g., a signal line) 270.

As shown in FIGS. 6A and 6B, each memory array 220 may include memory cells 215 (as shown in FIG. 2A), control gates 204 (such as word lines WL), and data lines 206 (such as bit lines BL). The source conductor 201 may extend over the memory arrays 220, and may be electrically coupled to the divided sources 210 using source contacts 230 adjacent one or more edges of each of the at least two divided sources 210.

In an embodiment, the signal conductor 270 may extend parallel with the source conductor 201. The signal conductor 270 may be electrically coupled to gates of transistors 290 using signal contacts 280 to provide control signals to the memory arrays 220. In an embodiment, the transistors 290 may be formed on a same semiconductor substrate 295. The semiconductor substrate 295 may include silicon, or other semiconductor materials.

Figure 7:
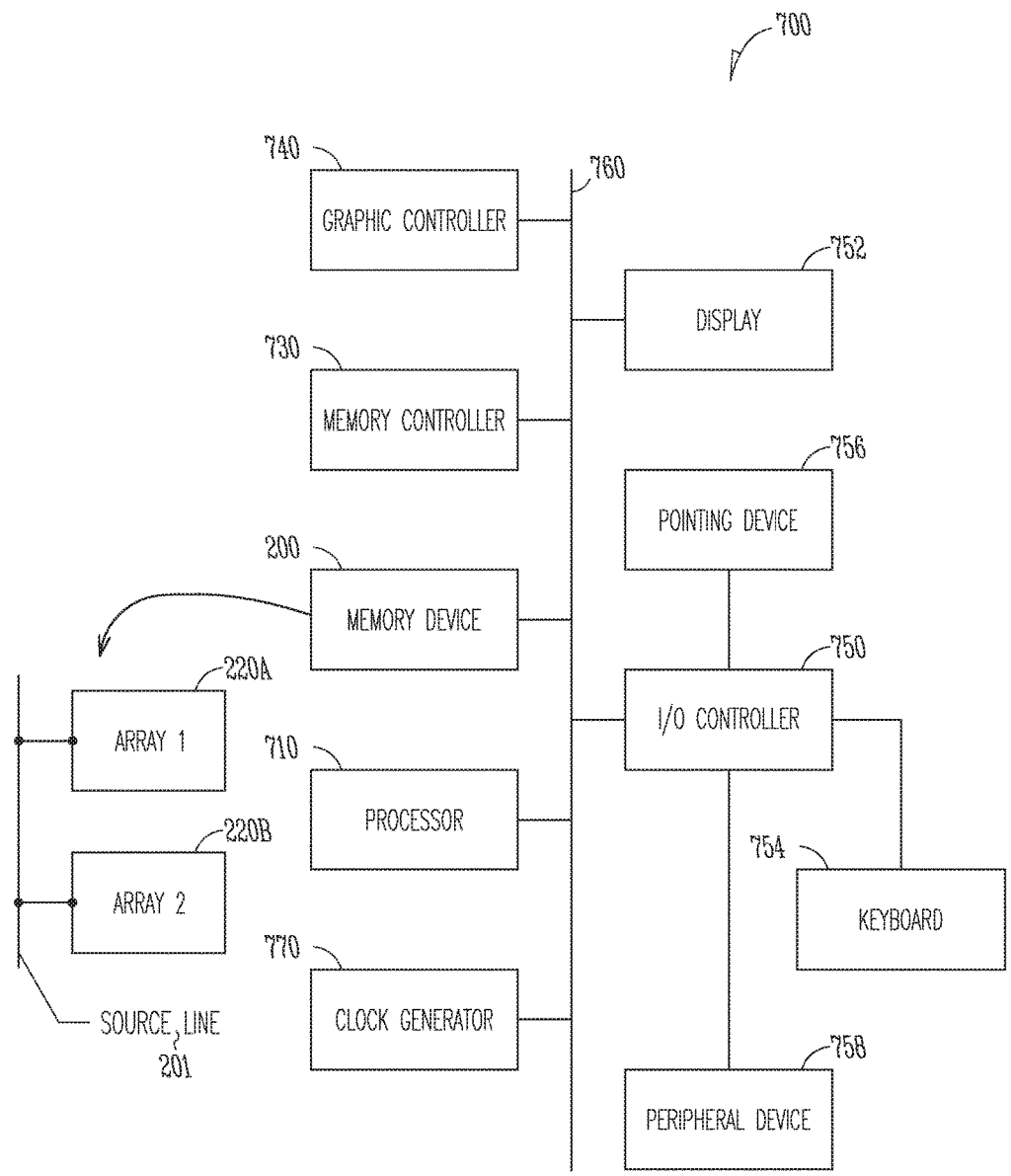
FIG. 7 is a diagram illustrating a system, according to an embodiment.

FIG. 7 is a diagram illustrating an apparatus in the form of a system 700, according to various embodiments of the subject matter. The system 700 may include a processor 710, a memory device 200, a memory controller 730, a graphic controller 740, an input and output (I/O) controller 750, a display 752, a keyboard 754, a pointing device 756, and a peripheral device 758. A bus 760 couples all of these devices together. A clock generator 770 is coupled to the bus 760 to provide a clock signal to at least one of the devices of the system 700 through the bus 760. The clock generator 770 may include an oscillator in a circuit board such as a motherboard. Two or more devices shown in system 700 may be formed in a single integrated circuit chip.

The bus 760 may be interconnect traces on a circuit board or may be one or more cables. The bus 760 may couple the devices of the system 700 by wireless means such as by electromagnetic radiations (for example, radio waves). The peripheral device 758 coupled to the I/O controller 750 may be a printer, an optical device such as a CD-ROM and DVD reader and writer, a magnetic device reader and writer such as a floppy disk driver, or an audio device such as a microphone.

The memory device 200 as shown in FIG. 7 may be a 3D NOT-AND-LOGIC (NAND) memory device for example. The memory device 200 may comprise one of the memory devices 200 described herein and shown in the FIGS. 2-6, according to various embodiments of the disclosure. In an embodiment, the memory device 200 may comprise divided memory arrays 220 (such as 220A and 220B), which may be electrically coupled to divided sources 210 (such as 210A and 210B as shown in FIG. 2A), and may share a source conductor 201, for example. Each memory array 220 may include memory cells 215, one or more control gates 204 (such as word lines WL), one or more data lines 206 (such as bit lines BL), and a source 210 of the divided sources 210, for example. The source conductor 201 may extend over the memory arrays 220, and may be electrically coupled to the divided sources 210 using source contacts 230 adjacent one or more edges of the divided sources 210.

In another embodiment, the memory device 200 may include only one memory array (such as 220A), which includes only one source 210. The source conductor 201 may extend over the memory array 220, and may be electrically coupled to the source 210 using source contacts 230 adjacent one or more edges of the source 210.

The system 700, as shown in FIG. 7, may include computers (e.g., desktops, laptops, hand-holds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

The above description and the drawings illustrate some embodiments of the application to enable those skilled in the art to practice the embodiments of the application. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The invention claimed is:

1. An apparatus, comprising:
   multiple source plates comprising at least a first source plate and a second source plate, the first source plate coupled to a first memory array, and the second source plate coupled to a second memory array;
   a source conductor extending in a first direction, the source conductor coupled to the first source plate through multiple first source contacts adjacent to each edge of a first pair of opposing edges of the first source plate, and coupled to the second source plate through multiple second source contacts adjacent to each edge of a second pair of opposing edges of the second source plate, wherein the first pair of opposing edges and the second pair of opposing edges extend in a second direction perpendicular to the first direction; and a plurality of bit lines extending in the second direction, wherein along the first direction, a first edge of the first pair of opposing edges of the first source plate is closer to a respective first source contact of the multiple first source contacts than any bit line, the respective first source contact located between the first pair of opposing edges and adjacent to the first edge of the first pair of opposing edges.

2. The apparatus of claim 1, wherein at least one of the first and second memory arrays includes vertical strings of memory cells, and control gates.

3. The apparatus of claim 1, wherein each source contact of the multiple first source contacts includes a third contact electrically coupled to the source conductor, a fourth contact electrically coupled to the first source plate of the multiple source plates, and a conductive connector connecting the third contact and the fourth contact, and wherein each source contact of the multiple second source contacts includes a fifth contact electrically coupled to the source conductor, a sixth contact electrically coupled to the second source plate of the multiple source plates, and a conductive connector connecting the fifth contact and the sixth contact.

4. The apparatus of claim 1, wherein the first and second source plates each comprise metal material.

5. The apparatus of claim 1, wherein the first and second source plates each comprise WSi material.

6. The apparatus of claim 1, wherein the first and second source plates each comprise a stack of metal material and polysilicon.

7. The apparatus of claim 1, wherein the first and second source plates each comprise a stack of WSi material and polysilicon.

8. The apparatus of claim 1, wherein along the first direction, a first edge of the second pair of opposing edges of the second source plate is closer to a respective second source contact of the multiple second source contacts than any bit line, and wherein the respective second source contact located between the second pair of opposing edges and adjacent to the first edge of the second pair of opposing edges.

9. A method of making an apparatus, comprising:
forming source plates comprising at least a first source plate and a second source plate;
forming a first memory array over and coupled to the first source plate, and forming a second memory array over and coupled to the second source plate;
forming a source conductor over the first memory array and the second memory array and extending in a first direction;
forming multiple bit lines extending in a second direction perpendicular to the first direction; and
forming multiple first source contacts adjacent to a first pair of opposing edges of the first source plate to couple the source conductor and the first source plate, the first pair of opposing edges of the first source plate extending in the second direction, wherein along the first direction, a first edge of the first pair of opposing edges is closer to a respective first source contact of the multiple first source contacts than any bit line, and wherein the respective first source contact is located between the first pair of opposing edges and adjacent to the first edge of the first pair of opposing edges.

10. The method of claim 9, further comprising forming multiple second source contacts adjacent to a second pair of opposing edges of the second source plate to couple the source conductor and the second source plate, the second pair of opposing edges extending in the second direction, wherein along the first direction, a first edge of the second pair of opposing edges is closer to a respective second source contact of the multiple second source contacts than any bit line, the respective second source contact located between the second pair of opposing edges and adjacent to the first edge of the second pair of opposing edges.

\* \* \* \* \*